(12) United States Patent
Xia et al.

(10) Patent No.: US 6,816,827 B1
(45) Date of Patent: Nov. 9, 2004

(54) VERIFICATION METHOD FOR COMBINATIONAL LOOP SYSTEMS

(75) Inventors: Yang Xia, Princeton, NJ (US); Pranav N. Ashar, Princeton, NJ (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/410,087

(22) Filed: Oct. 1, 1999

(51) Int. Cl.$^7$ .............................................. G06F 17/50
(52) U.S. Cl. ............................................ 703/15; 716/4
(58) Field of Search ................................ 716/4; 703/15

(56) References Cited

U.S. PATENT DOCUMENTS

| | | | | |
|---|---|---|---|---|
| 5,389,838 A | * | 2/1995 | Orengo ........................ | 326/93 |
| 5,461,573 A | * | 10/1995 | Chakradhar et al. ............ | 716/4 |
| 5,469,367 A | * | 11/1995 | Puri et al. ...................... | 716/18 |
| 5,502,647 A | * | 3/1996 | Chakradhar et al. ............ | 716/4 |
| 5,515,292 A | * | 5/1996 | Roy et al. ........................ | 716/2 |
| 5,796,985 A | * | 8/1998 | O'Brien et al. ................. | 716/6 |
| 6,009,531 A | * | 12/1999 | Selvidge et al. ............. | 713/400 |
| 6,105,139 A | * | 8/2000 | Dey et al. .................... | 713/300 |
| 6,145,073 A | * | 11/2000 | Cismas ......................... | 712/25 |
| 6,247,154 B1 | * | 6/2001 | Bushnell et al. ............. | 714/733 |

OTHER PUBLICATIONS

Xia, Yang; Ashar, Pranav; "Verfication of a Combinational Loop Based Arbitration Scheme in a System–On–Chip Integration Architecture"; VLSI Design, 2000, Thirteenth International Conference on Jan. 3, 2000–Jan. 7, 2000, Calcutta, India; pp. 449–454.*

Alan J. Hu, "Formal Hardware Verification with BDDs: An Introduction," IEEE, Aug. 1997, pp. 677–682.*

Herve J. Touari, Hamid Savoj, Bill Lin, Robert K. Brayton, Albert Sangiovanni–Vincentelli, "Implicit State Enumeration of Finite State Machines using BDD's", IEEE 1990, Electrical Engineering and Computer Scineces Department, U of Cal. pp. 130–133.*

Edward J. McCluskey, "Logic Design Principles with Emphasis on Testable Semicustom Circuits", Prentice–Hall, 1986, pp. 29–34.*

E. Allen Emerson and Kedar S. Namjoshi, "Reasoning About Rings", Department of Computer Sciences, The University of Texas at Austin, 1995.

(List continued on next page.)

*Primary Examiner*—Kevin J. Teska
*Assistant Examiner*—Dwin M. Craig
(74) *Attorney, Agent, or Firm*—Sughrue Mion, PLLC

(57) ABSTRACT

A design verification method for verifying hardware designs utilizing combinational loop logic. A design verification system is provided wherein a model checker receives both a mathematical representation of the functionality of a design and a set of properties against which the mathematical model is to be checked. If the design contains a combinational loop wherein the output directly depends on its own output and must be logically completed within a single bus cycle, then modifications to the model are undertaken. A minimal number of flip-flops are first added to the combinational loop in order to break up the combinational dependency. All of the states of a state machine model of the design are then supplemented with a twin state which is exactly the same as the original state. If the current state is an original state then the next cycle progresses the state machine to twin state of the particular original state. If the current state is a twin state, then the state machine progresses to the next new original state. Thus, by modifying the model in a generic straightforward manner, the design containing a combinational loop can be verified with currently available verification systems without requiring any modifications to the model checker itself.

8 Claims, 6 Drawing Sheets

OTHER PUBLICATIONS

Drew Wingard and Alex Kurosawa, "Integration Architecture for System–On–A–Chip Design", Sonics, Inc., Los Altos, CA, 1998.

Yuji Kukimoto and Jae–Young Jang, "VIS CTL SYNTAX", University of California, Berkeley and University of Colorado, Boulder, Feb. 27, 1997.

R.K. Brayton et al., VIS: A System for Verification and Synthesis. Technical Report UCS/ERL M95, Electronics Research Lab, University of California Berkeley, CA, Dec. 1995.

K. McMillan. *Symbolic Model Checking*. Kluwer Academic Publishers, Boston, 1993.

S. Rajan, N. Shankar, and M. Srivas, An Integration of Model Checking with Automated Proof Checking. In *Proceedings of the Workshop on Computer–Aided Verification (CAV 95)*, pp. 84–97, 1995.

* cited by examiner

VERIFICATION METHOD FOR COMBINATIONAL LOOP SYSTEMS

BACKGROUND OF THE INVENTION

The present invention relates generally to a method and system for carrying out design verification on hardware circuit designs that include combinational loop logic. More specifically, the present invention is directed to a method that can be used in conjunction with existing model checking systems to verify token ring arbitration schemes without requiring modification to the model checker being used.

Formal verification tools refer to a body of software and hardware used to verify the design of a digital circuit and/or computer related hardware. Verification is typically performed prior to the first hardware article being physically manufactured. Thus, the high cost of redesign that attaches after circuits are built is often avoided.

Mathematical models representative of the hardware article's functional design are initially developed and written in a language, i.e., Verilog or VHDL, which is suitable to be input to a software verification tool, such as VIS. The model, thus developed, is typically a set of formulas that theoretically represent all of the possible conditions of the article being verified. It is common to think of the possible states of a digital system as represented by a set of zeros and ones. A zero typically represents a non-energized (OFF) state of a given signal, input or output, whereas a one represents an energized (ON) state.

In addition to the mathematical model of the circuit design being verified, the verification tool also requires a set of properties against which the model will be checked. These properties are often provided in a form of temporal logic that describes the desired state of the design at different points in time.

Once both the model of the design itself and the properties against which the design will be checked are input to the verification system, an output is provided from the verification system indicating whether or not the modeled design performs the desired functions appropriately given the constraints supplied. If the model checked violates one or more of the properties provided, the system then indicates which particular properties have been violated so appropriate modifications can be made to the model, which in turn may lead to modifications to the circuit design of the hardware article.

Typically, a circuit design can be modeled in state machine format which comprises the set of all possible states that a particular design can occupy at any given time. Once all of the possible states are known, it is determined how the design would get into any particular state, i.e. what inputs are necessary and what prior conditions must be satisfied. This task is not usually particularly difficult for most circuit designs that include flip-flops. Since each change of condition of a flip-flop is considered a change of state, making the development and verification of models for such circuits a relatively straight-forward endeavor. However, when the design being verified contains a combinational loop, wherein no flip-flops exist, the task becomes extremely difficult, if not impossible. In a state-machine that represents a combinational loop, the state of the design at any given time would depend on itself. Conventional model checkers cannot handle this situation because, for example, VIS attempts to express all signals formally before model checking can begin. Since there are no flip-flops between the input and the output of the circuit, the output becomes a combinational function of the input. As a result, a circularity problem arises and the model cannot be verified since no known model checking system can handle this condition. In other words, if a particular circuit design comprises logic formed in a loop topology, with no flip-flops within the loop, the result, or state, of the circuit at any given time will depend directly on its present state; thus causing a circularity problem that presently cannot be resolved without modifying the model checker.

SUMMARY OF THE INVENTION

In view of the aforementioned problems with the conventional approach to modeling and verifying the circuit design of hardware systems that contain combinational loop logic, the present invention provides a method whereby circuits that include combinational loop logic can be verified without requiring any changes to the model checker being used.

In one aspect of the invention, a model is provided representing the design of an architecture that employs combinational loop logic. The model might comprise various finite state machines interconnected to one another. A flip-flop is added to break the combinational loop and each of the state machines is modified by providing a twin-state in the state machine corresponding to each original state, effectively doubling the total number of states within each state machine.

More specifically, in accordance with the first aspect of the invention, the steps of determining the location of a combinational loop within a design; providing a model of the design including the combinational loop wherein the model comprises one or more finite state machines, each finite state machine comprising at least one original state; inserting at least one flip-flop within the model, and; providing a twin-state for each original state within each of said finite state machines wherein each twin-state is identical to its respective original state are performed.

As the state machine model is prompted by the verification system to progress through its successive states, the state machine jumps from an original state to the original state's respective twin-state and then on to the next original state and then on to that original state's twin-state and so on until the state machine cannot continue given the present inputs. Thus, the combinational loop is modified by placing a flip-flop within the loop and then each finite state machine existing on the loop is modified by adding a second identical state for each original single state.

In a second aspect of the invention the technique described above with respect to the first aspect of the invention is applied to a token ring, or round robin, arbitration scheme of a two level arbitration architecture. Due to typical network communication constraints, a token ring arbitration decision, i.e., which one of a plurality of clients with access to the network will be granted immediate rights to communicate on the bus, must be made within a single cycle of the bus. Thus, according to this aspect of the invention, a combinational loop exists in some implementations of a token ring arbitration scheme. The above mentioned technique is then applied in order to model the design and then apply the resultant model to an existing model checking system. In accordance with the technique discussed above, initially a flip-flop is added to the combinational loop and then each state within the individual state machine models of the token-ring arbitration scheme is provided with a twin state.

More specifically, in accordance with the second aspect of the invention, the steps of developing a finite state machine model for each client on a ring, wherein each finite state machine model comprises at least one original state; inserting a flip-flop model between two of the clients, and; adding a twin-state for each original state within each of the finite state machine models, wherein each twin-state is identical to its respective original state are performed.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE PREFERRED EMBODIMENTS

According to one aspect of the present invention, an arbitration scheme is provided that determines which one of a plurality of clients, each interconnected to one another on a network, is granted access for communication to a common bus at a given time. For example, according to a known architecture, a two-level arbitration scheme is used. A primary arbitration level may be that of the well known Time Division Multiplexed Access (TDMA) protocol and a secondary level may be a Token Ring, or round robin, scheme. As the term TDMA suggests, the primary arbitration level is a scheme wherein a predetermined number of bus cycles are allocated to each client on the bus. During their respective bus cycles, each client is given the highest priority and can immediately communicate over the bus if the respective client so requires. A bus cycle is a periodic duration of time available for reading or writing on the bus and, hence, communicating with other clients. After all of the necessary bus cycles are allocated to the prospective clients for the TDMA level of arbitration, all non-allocated cycles are then available for use in the second, token ring level of arbitration. Also, cycles that are allocated in the primary arbitration level, but are then not used by the respective client, are also available to be used by the token ring arbitration scheme.

In a token ring arbitration scheme, the arbitration determination as to which client will gain access to the bus must be completed within a single bus cycle. Therefore, the token ring necessitates a combinational loop that comprises a combinational logic circuit with no clocked devices, such as flip-flops or registers. At the time a model is developed for a circuit design that uses both of the arbitration schemes discussed above, a finite state machine (FSM) for both levels of arbitration must be provided for every client. A state machine model of the first, TDMA, level of arbitration typically presents little difficulty. The TDMA model includes various clocked devices since it is known beforehand which bus cycle has been allocated to each client. Thus, when stimulated with the appropriate inputs, the state machine for each client's TDMA protocol simply progresses through each of its respective states until the state wherein it gains access during its bus cycle is presented.

Figure 1:
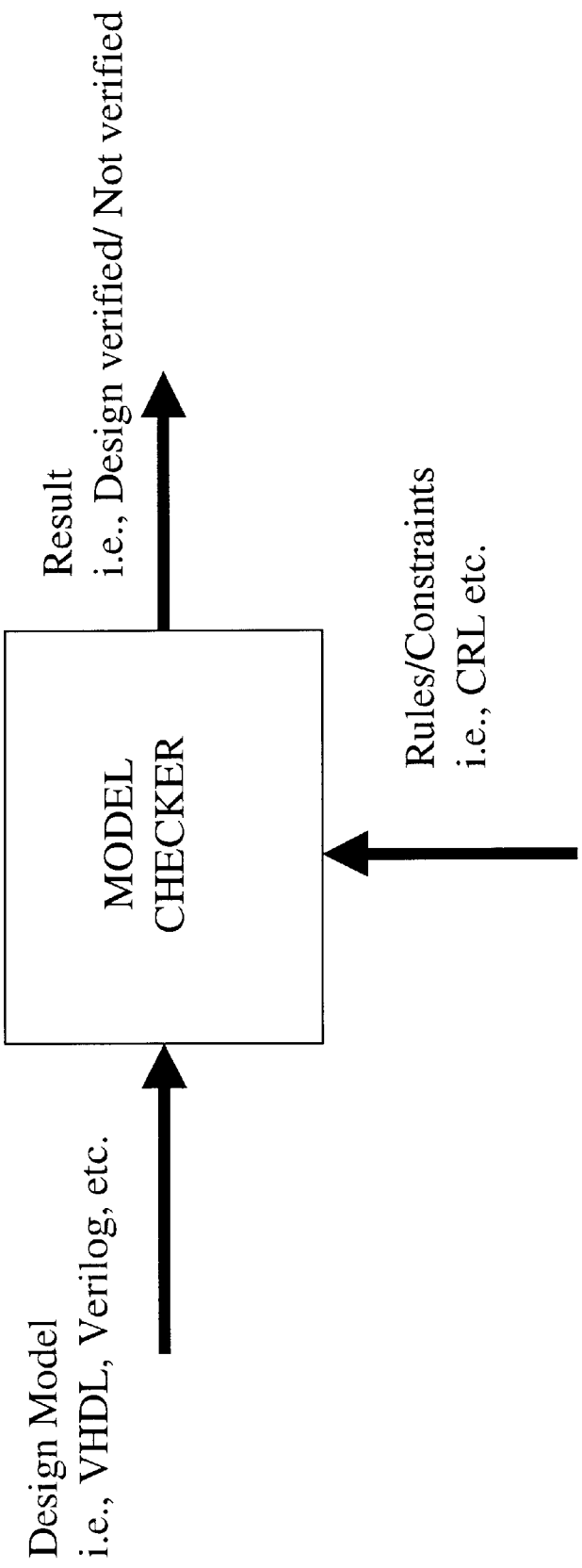
FIG. 1 is a block diagram illustrating a basic verification system.
Figure 2:
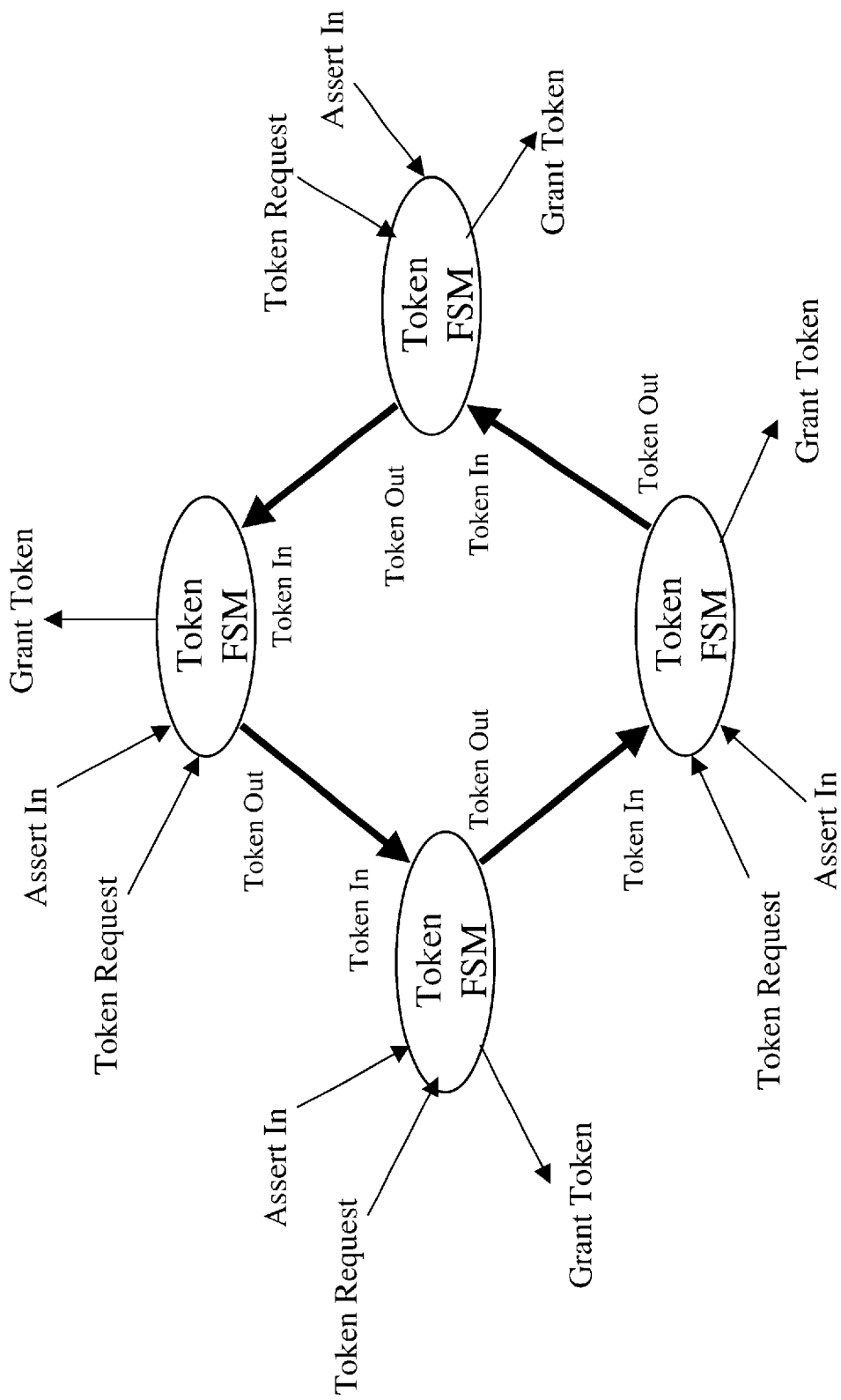
FIG. 2 is a flow diagram of a conventional token ring architecture with combinational feedback.

The state machine for the second or token ring level of arbitration, referred to as a Token FSM, however, presents the verification system with the difficulty discussed above, that of a combinational loop. The interconnection of the Token FSMs which are participating in the round robin arbitration scheme prior to the invention being implemented is shown in FIG. 2. In FIG. 2, for example, four interconnected clients are represented by four Token FSMs. Each Token FSM corresponds to a Finite State Machine for the token ring arbitration protocol of the respective client on the bus. When any of the four clients desire access to the bus, and the arbitration determination has been relegated to the second level, token ring, arbitration scheme, because either that particular bus cycle has not been allocated to a client or the client to which the bus cycle has been allocated does not require access at that time, the client desiring access will assert its "Token Request" signal which is used by the Token FSM for that client.

The other inputs to the Token FSMs are "Assert In", which indicates that the respective client plans to use its allocated bus cycle slot, i.e., the time period allocated in the primary, TDMA level of arbitration; "Reset", which is merely a reset to the FSM; and "Token In", which represents the token being passed from one client to the next client in line on the bus. Outputs from each Token FSM are "Grant Token", which indicates to the client that it has been granted the token for the particular bus cycle; and "Token Out", the counterpart to "Token In", which represents the token being passed from the respective FSM.

As mentioned above, during the time when the token ring arbitration level is invoked the determination of which client will be given the token and, hence, granted access to the bus in a given cycle, must be completed within a single bus cycle. Therefore, each Token FSM comprises combinational logic and the four Token FSMs taken together form a combinational loop.

According to the present invention, a flip-flop is added somewhere within the combinational loop, thus breaking the combinational dependency. Each Token FSM is then modified in order to maintain the correct implementation of the arbitration protocol.

The additional flip-flop provided in the combinational loop can be placed anywhere within the loop. For example, FIG. 3 illustrates the addition of a single flip-flop in accordance with the present invention within the token ring loop between two of the Token FSMs.

Figure 3:
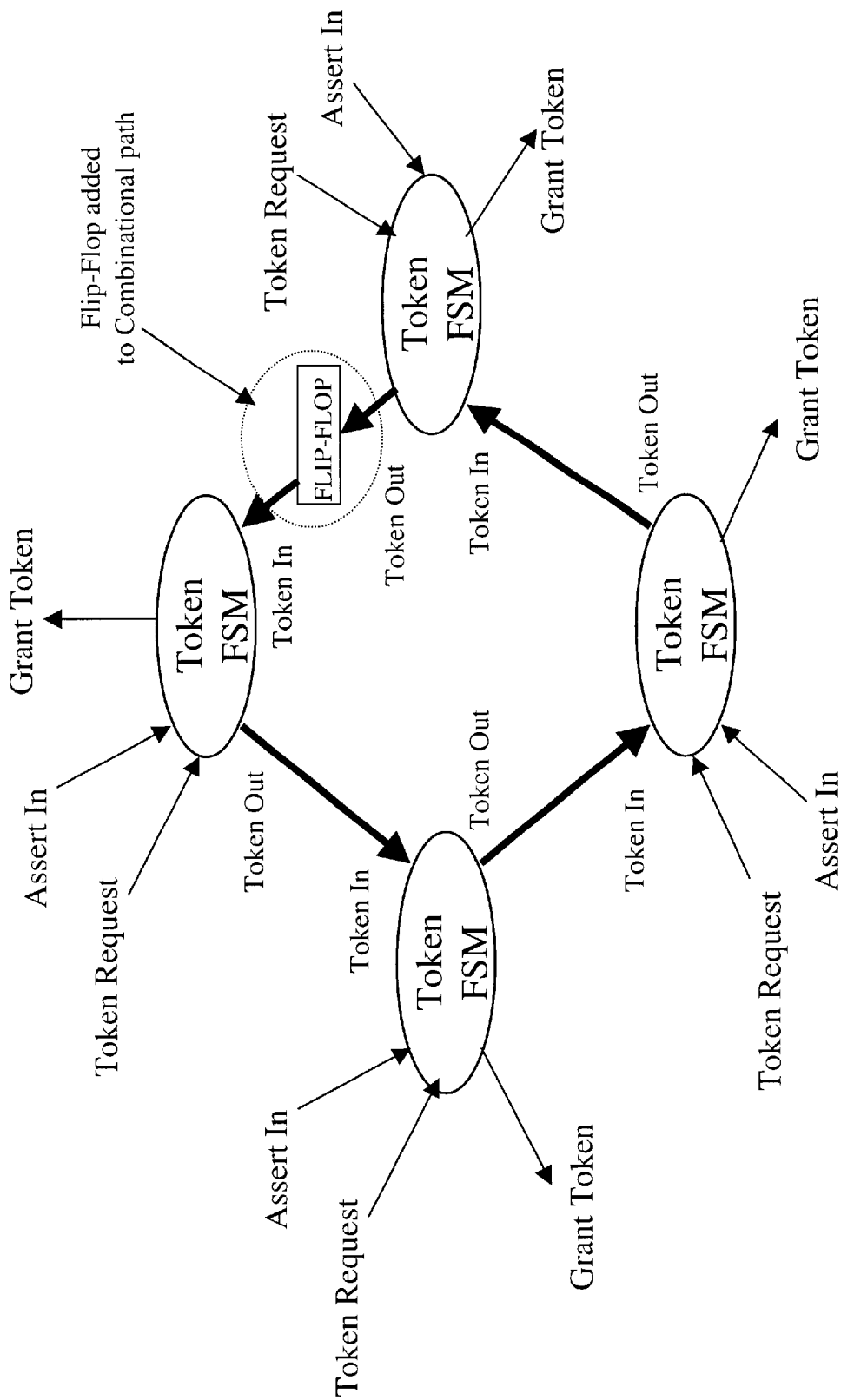
FIG. 3 is a flow diagram of a modified token ring architecture in accordance with the present invention.
Figure 4:
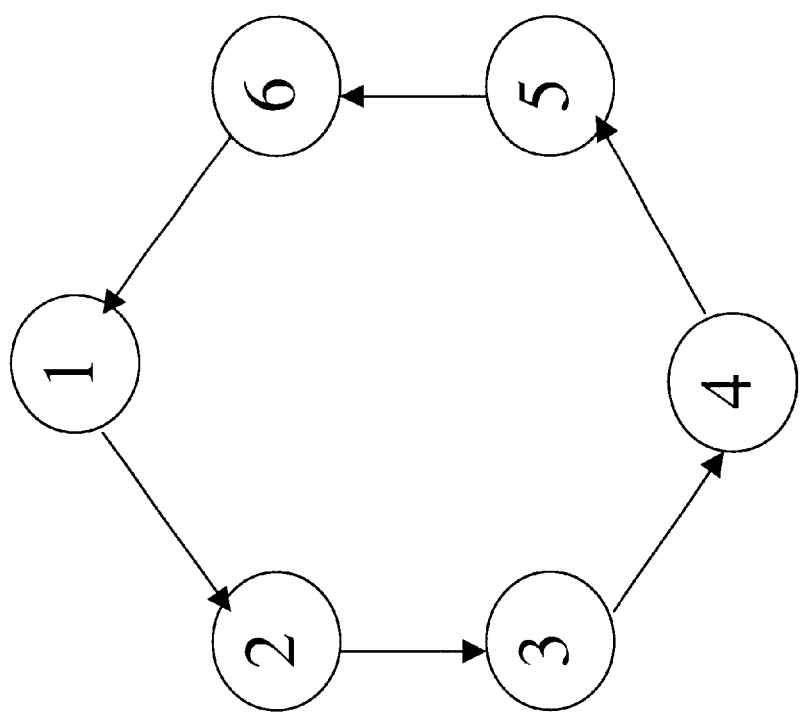
FIG. 4 is a state machine diagram in accordance with a conventional method of modeling a design.

FIG. 4 illustrates what sample Token FSM might look like. When the state machine is in state 1 and a predetermined set of conditions are present, the state machine may advance from state 1 to state 2. Then, once in state 2 and a different set of predetermined conditions are present, the state machine may advance to state 2, and so on. The example of FIG. 3 is a simple representation of a sample state machine diagram, one skilled in the art would understand that an unlimited number of different state machines are possible.

Figure 5:
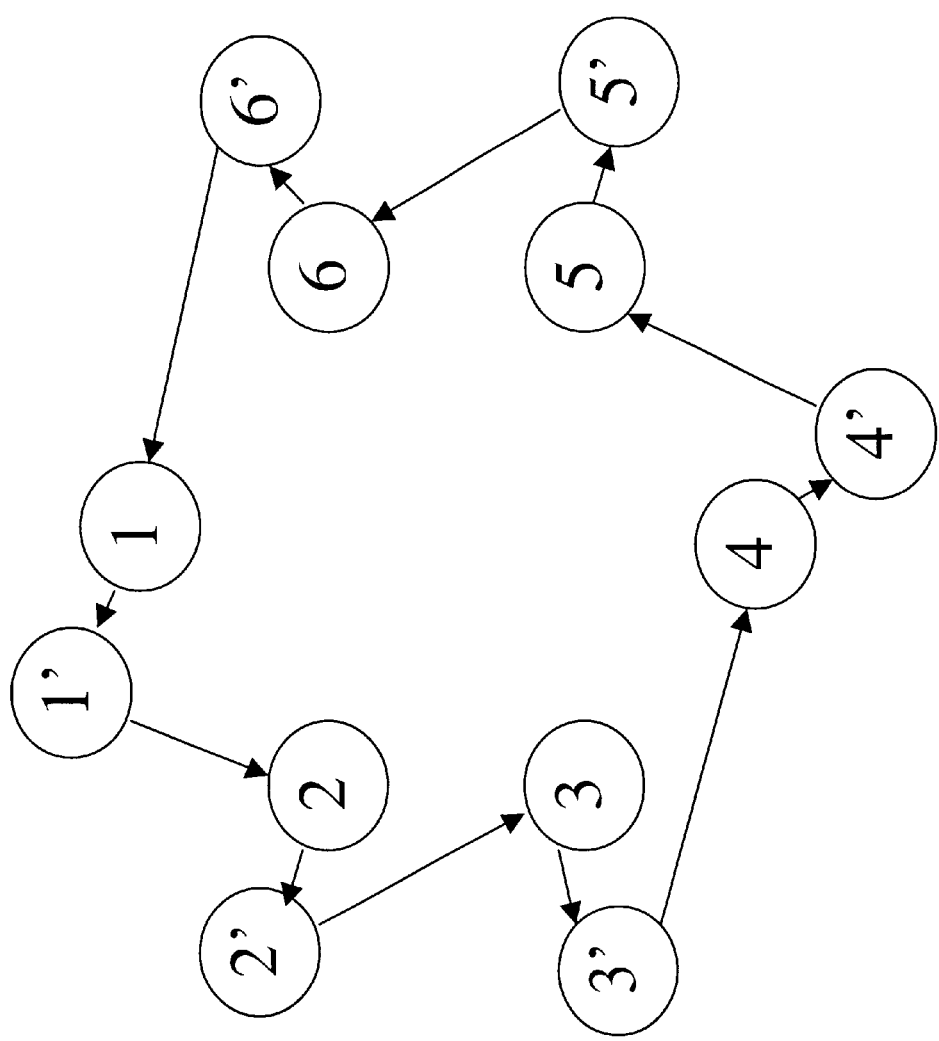
FIG. 5 is a modified state machine diagram in accordance with the present invention.

Once a flip-flop is added to the loop as shown in FIG. 3, however, the functionality of the arbitration protocol becomes corrupted due to the additional clock cycle required to get passed the flip-flop that now exists within the loop. In order to correct this problem and return the functionality of the model to a functionality equivalent to what it was before the flip-flop was added, each Token FSM as shown, for example, in FIG. 4 must be modified, as illustrated in FIG. 5, to compensate for the additional flip-flop in the loop.

Accordingly, each state within the Token FSM, e.g., states 1 and 2, is provided with a twin state, e.g., states 1' and 2', thus, doubling the total number of states within the state machine model. Each Token FSM is constructed such that if the current state is one of the original states, it will always go into its twin state in the next cycle. On the other hand, if the current state is one of the twin states, the Token FSM will progress to a new original state in the next cycle. The state it progresses to will be exactly the state that the original Token FSM would have gone to as a result of the corresponding Token Request and Token Input. Thus, the new FSM effectively updates its next state every two cycles when the flip-flop is in the loop, while the original FSM updates its next cycle every cycle when there is no flip-flop in the loop. Every state within the Token FSM must be modified in the same manner whereby each of the original state transitions are merely delayed by a single cycle.

The original, unmodified FSM, generates the "Token Out" and "Grant Token" signals purely as a function of the current state and the inputs from the client and/or from neighboring FSMs. Since the output circuit is left unchanged, i.e., the twin state generates the same output value as the original state, each Token FSM located between the token and the flip-flop which was added to break the loop generates the correct output in both the first and second cycles. The remaining Token FSMs generate the correct output in the second cycle only. Thus, in the second cycle every Token FSM will have the correct value of the "Token In" input signal with which it must determine the next state. Note that the primary inputs to the FSMs are adjusted so that they only change on even numbered clock cycles.

The above mentioned technique, although applied here to the specific combinational loop which exists in a token ring arbitration scheme, is equally applicable to more generic combinational loops. For example, if the state machine had been much larger, the same modification of delaying the state transition could have been carried out implicitly by means of simple Boolean operations on a Binary Decision Diagram (BDD) based transition relation representation of the FSM. Assume $\chi$ is the original transition relation encapsulating all the valid pairs of present states and next states, and PS and NS are the present state and next state variables, respectively. Also, further assume that the state doubling was carried out by the addition of a new present state variable $PS_{new}$ and a new next state variable $NS_{new}$. These new variables assume the value '0' for the twin state and the value '1' for the original state. The encoding in the remaining bits is the same for the twin and the original states. Thus, the new transition relation is computed as:

$$\chi_1 = \chi \cdot (PS'_{new} \cdot NS_{new}),$$

$$\chi_2 = PS_{new} \cdot NS'_{new} \cdot \Pi_{i=1 \text{ to } N}(PS'_i \cdot NS'_i + PS_i \cdot NS_i),$$

$$\chi_{new} = \chi_1 + \chi_2$$

where N is the number of state variables in the original machine.

Using the modified transition relation for each individual FSM, and the transition relation for the single flip-flop added to break the combinational feedback, the transition relation for the entire token ring can be obtained for use in model checking. Note, the new output function is also easily obtained since we wish the outputs in the twin states to be the same as in the original states. If $\psi$ was the original output function, the new output function is easily obtained as:

$$\psi_{new} = \psi \cdot (PS_{new} + PS'_{new}),$$

which is exactly the same as the original output function $\psi$. This is a general technique and is not dependent on the individual FSMs connected in the ring being identical.

Figure 6:
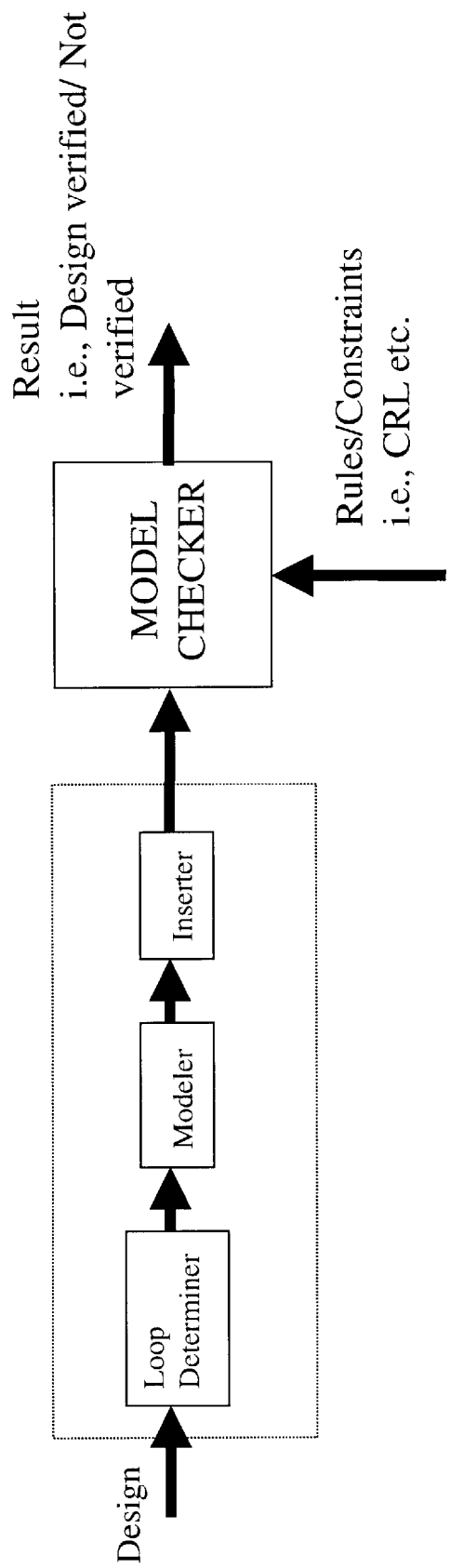
FIG. 6 is a block diagram of a system for performing the verification method in accordance with the present invention.

FIG. 6 illustrates a block diagram of a system that contains devices for carrying out the method described above. A determining means initially determines whether a particular circuit design contains any combinational loops. If so, a model is generated for the design by breaking the combinational loop wherein the model typically contains at least one finite state machine and each finite state machine contains at least one original state that can be entered or exited depending on a predetermined set of conditions occurring. The set of conditions required to enter or exit each state typically consists of the present states of input signals provided to the design and the present condition of circuit at the time the input signals are provided. After the model is generated, an inserter then inserts a flip-flop, or a model of a flip-flop, into the design where the combinational loop was broken and provides a twin-state for each of the states within each finite state machine such that each of the original states now has the same output function as before but fans out only to its twin state, and each twin state has the same fanout as its corresponding original state.

With the model modified as discussed above, either for the general combinational loop case or the token ring protocol case, it becomes feasible to check the desired properties of a design containing a combinational loop using existing model checking systems.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A design verification method capable of verifying designs with one or more combinational loops, said method comprising the steps of:
   (a) determining the location of a combinational loop within a design;
   (b) providing a model of the design by breaking the combinational loop, wherein said model comprises at least one finite state machine, each finite state machine comprising at least one original state;
   (c) providing a twin-state for each original state within each of said finite state machines such that each twin state has the same fanout and output function as its corresponding original state, and each original state maintains its respective output function but fans out only to its corresponding twin state;
   (d) inserting at least one flip-flop within said design at the location where the combinational loop was broken, and making a simple two-state model for the flip-flop;
   (e) combining the model of the design with the model of the flip-flop by taking the product of the two finite state machines to generate an overall modified model;
   (f) checking correctness properties on the modified model.

2. A method as claimed in claim 1 wherein there are more than one combinational loops and steps (a) through (e) are applied repeatedly until all combinational loops have been modified, then step (f) is conducted.

3. A method as claimed in claim 2 wherein the smallest number of flip-flops is added to break all combinational loops.

4. A method as claimed in claim 1 wherein each of said finite state machines is represented by a Binary Decision Diagram (BDD) based transition relation.

5. A method as claimed in claim 1 wherein each of said finite state machines is represented by Boolean expressions.

6. A design verification method capable of verifying a token ring arbitration scheme amongst a plurality of clients, said method comprising the steps of:

(a) developing a finite state machine model for each client on said ring wherein each of said finite state machine models comprises at least one original state;

(b) inserting a flip-flop model between two of said clients;

adding a twin-state for each original state within each of said finite state machine models wherein each twin-state is identical to its respective original state.

7. A method as claimed in claim 6 further comprising the steps of;

(d) modifying the finite state machine model for each client such that if a current state is one of said original states, the model progresses to the corresponding twin-state of said original state and if said current state is one of said twin-states, then the model progresses to a next original state.

8. A design verification system for verifying a circuit design that contains at least one combinational loop, said system comprising:

a determining means determining the location of a combinational loop within a design;

a modeling means providing a model of the design, wherein said model comprises at least two finite state machines, each finite state machine comprising at least one original state; and an insertion means inserting at least one flip-flop within said model and a plurality of twin-states corresponding to each original state within each of said finite state machines, wherein each of said twin-states is identical to its respective original state.

* * * * *